United States Patent [19]

Tanno et al.

[11] Patent Number: 5,449,942
[45] Date of Patent: Sep. 12, 1995

[54] RARE EARTH OXIDE-BASED GARNET SINGLE CRYSTAL FOR MAGNETOSTATIC DEVICE AND METHOD FOR THE PREPARATION THEREOF

[75] Inventors: Masayuki Tanno; Toshihiko Ryuo, both of Gunma, Japan

[73] Assignee: Shin-Etsu Chemical Co., Ltd., Tokyo, Japan

[21] Appl. No.: 189,932

[22] Filed: Feb. 1, 1994

[30] Foreign Application Priority Data

Feb. 10, 1993 [JP] Japan .................. 5-022540

[51] Int. Cl.⁶ .................. B32B 9/00; B32B 19/00
[52] U.S. Cl. .................. 257/421; 428/693; 428/900; 252/62.57
[58] Field of Search .............. 257/421; 428/692, 693, 428/900, 694 GT, 694 SC; 252/62.57

[56] References Cited

U.S. PATENT DOCUMENTS 4,435,484  3/1984  Breed et al. .................. 428/693
4,544,239  10/1985  Shone et al. .................. 350/376
4,625,390  12/1986  Shone et al. .................. 29/576 B

*Primary Examiner*—Sara W. Crane
*Attorney, Agent, or Firm*—McAulay Fisher Nissen Goldberg & Kiel

[57] ABSTRACT

Proposed is a novel rare earth oxide-based magnetic garnet single crystal in the form of a film epitaxially grown in the crystallographic direction of <111> on the substrate of a rare earth oxide-based garnet single crystal, which is useful as a magnetostatic device such as high-frequency oscillators capable of exhibiting improved temperature characteristics. The magnetic garnet single crystal is characterized by the specific chemical composition of the formula $(Bi_xR_{3-x})(Fe_{5-y}M_y)O_{12}$, in which R, is a rare earth element selected from the group consisting of Y, Lu, La or a combination thereof, M is Ga, Al or a combination thereof, x is 0.02 to 0.4 and y is 0.6 to 0.8, and also by the specific value of the growth-induced magnetic anisotropy constant $Ku^g$ in the range from $0.3 \times 10^4$ to $1.5 \times 10^4$ erg/cm³ in the crystallographic <111> direction which can be imparted by an annealing heat treatment at a specified temperature.

3 Claims, 4 Drawing Sheets

MAGNETIC FIELD, Oe

MAGNETIC FIELD, Oe

RARE EARTH OXIDE-BASED GARNET SINGLE CRYSTAL FOR MAGNETOSTATIC DEVICE AND METHOD FOR THE PREPARATION THEREOF

BACKGROUND OF THE INVENTION

The present invention relates to a rare earth oxide-based garnet single crystal for magnetostatic device and a method for the preparation thereof. More particularly, the invention relates to a rare earth oxide-based garnet single crystal for magnetostatic device used in the microwave region such as filters, resonators, oscillator elements, signal-noise enhancers, isolators, circulators and the like and a method for the preparation of such a single crystal as well as to a magnetostatic device constituted by using the same.

As to the rare earth oxide-based garnet single crystal for magnetostatic devices, proposals have been made in the prior art for those having an epitaxially grown film of YIG (yttrium iron garnet) on the surface of a substrate garnet single crystal. Magnetostatic devices having such a garnet element have a defect that the temperature dependence of the saturation magnetization $4\pi Ms$ of the YIG film is so large that the magnetic field applied to the YIG film must be varied in a wide range in order to decrease the temperature dependence of the working frequency of the device while such a means can be undertaken only with an elaborate instrumentation for the temperature compensation of the magnetic field consequently resulting in a great increase of the overall costs of the magnetostatic device. It is accordingly desirable to decrease the temperature dependence of the YIG film per se so low that no means for temperature compensation of the magnetic field is necessitated any longer to provide a magnetostatic device of good temperature characteristics at low costs.

In this regard, various proposals and attempts have been made heretofore for decreasing the temperature dependence of YIG films. For example, H. L. Glass, et al. disclose in Material Research Bulletin, volume 12, pages 735 to 740 (1977), that the vertical resonance magnetic field of a garnet film having a composition expressed by the formula of $La_{0.06}Y_{2.34}Fe_{4.73}Ga_{0.87}O_{12}$ with a saturation magnetization of 410 G exhibits a quadratic temperature dependence assuming a constant frequency and P. Roschmann, et al. disclose in Material Research Bulletin, volume 18, pages 449 to 459 (1983), that a garnet of the formula $YSFe4.07Ga0.93O12$ exhibits a quadratic temperature dependence of the ferromagnetic resonance frequency at or in the vicinity of room temperature assuming a constant magnetic field to have a relatively good stability of the resonance frequency against temperature changes.

The principal mechanism of the above mentioned temperature compensation effects can be described in terms of the Kittel's resonance equation relative to the vertical resonance in the direction of $<111>$:

$$f = r \cdot (Hres - N \cdot 4\pi Ms - 4/3 \cdot K1/Ms), \tag{I}$$

in which f is the frequency, r is the gyromagnetic ratio, $4\pi Ms$ is the saturation magnetization, Hres is the vertical resonance magnetic field, N is the effective demagnetization factor or so-called garnet coefficient and K1 is the first-order anisotropy constant of a cubic crystal.

While the temperature compensation effect reported in the above mentioned literatures is presumably due to offsetting between the changes in the $4\pi Ms$ and the changes in the K1 caused by the changes in temperature, the ranges of the changes in the resonance frequency or resonance magnetic field are reportedly only 10 MHz or 3 Gauss, respectively, corresponding to a temperature change of 40° C. at or in the vicinity of room temperature not to give a practical means as a solution of the above mentioned problems.

It is reported by T. Ryuo et al. in Preprints of IEEE Ultrasonic Symposium (1988), pages 237 to 240, that a rapid degradation is caused in the magnetic resonance half value width $\Delta H$ corresponding to 500 G or smaller $4\pi Ms$ at room temperature in a YIG film substituted by lanthanum and gallium epitaxially grown on a substrate of a yttrium-substituted GGG (gadolinium gallium garnet) prepared by the liquid-phase epitaxial method and exhibiting the same degree of the temperature compensation effect as mentioned above. These situations imply that it would be a difficult matter to prepare a low-loss magnetostatic device from the above described temperature-compensating materials because of the insufficient temperature compensation and poor $\Delta H$ value.

In order for a magnetostatic device to be practically used as a high-frequency signal processing device, it would be an essential requirement that the frequency change of a magnetostatic device should not exceed 10 MHz within a temperature range equal to or 40° C. or even broader in the vicinity of room temperature corresponding to about 3 Gauss or smaller of the variation in the vertical resonance magnetic field. Further, the $\Delta H$ value at 9.2 GHz must be 1.5 Oe or smaller in order to prepare a low-loss magnetostatic filter or a high-Q magnetostatic resonator. It is accordingly desired to provide a magnetostatic device suitable for these practical applications at low manufacturing costs.

SUMMARY OF THE INVENTION

The present invention accordingly has an object, by solving the above described problems in the prior art, to provide a rare earth oxide-based garnet single crystal for magnetostatic device and a method for the preparation of such a single crystal as well as to a magnetostatic device constituted by using the same.

Thus, the present invention provides a rare earth oxide-based magnetic garnet single crystal in the form of a film epitaxially grown in the crystallographic direction of $<111>$ on the substrate of a rare earth oxide-based garnet single crystal followed by a heat treatment at a temperature of, preferably, from 800° to 1200° C., the said rare earth oxide-based magnetic garnet single crystal in the form of an epitaxially grown film having a chemical composition expressed by the formula $$(Bi_xR_{3-x})(Fe_{5-y}M_y)O_{12} \tag{II}$$

in which R is a rare earth element selected from the group consisting of yttrium, lutetium and lanthanum or a combination thereof, M is gallium, aluminum or a combination thereof, the subscript x is a positive number in the range from 0.02 to 0.4 and the subscript y is a positive number in the range from 0.6 to 0.8, and the growth-induced magnetic anisotropy constant $Ku^g$ in the erg/cm³ unit of the said rare earth oxide-based magnetic garnet single crystal in the form of an epitaxially grown film being in the range from $0.3 \times 10^4$ to $1.5 \times 10^4$ in the crystallographic $<111>$ direction.

Further, the magnetostatic device of the invention comprises the elements of:

(a) a layer of the rare earth oxide-based magnetic garnet single crystal in the form of an epitaxially grown film as defined above;

(b) a pair of electrodes provided on the surfaces of the element (a); and (c) a means for generating a magnetic field in the direction perpendicular to the principal plane of the element (a).

DETAILED DESCRIPTION OF THE PREFERRED EMBODIMENTS

Figure 1:
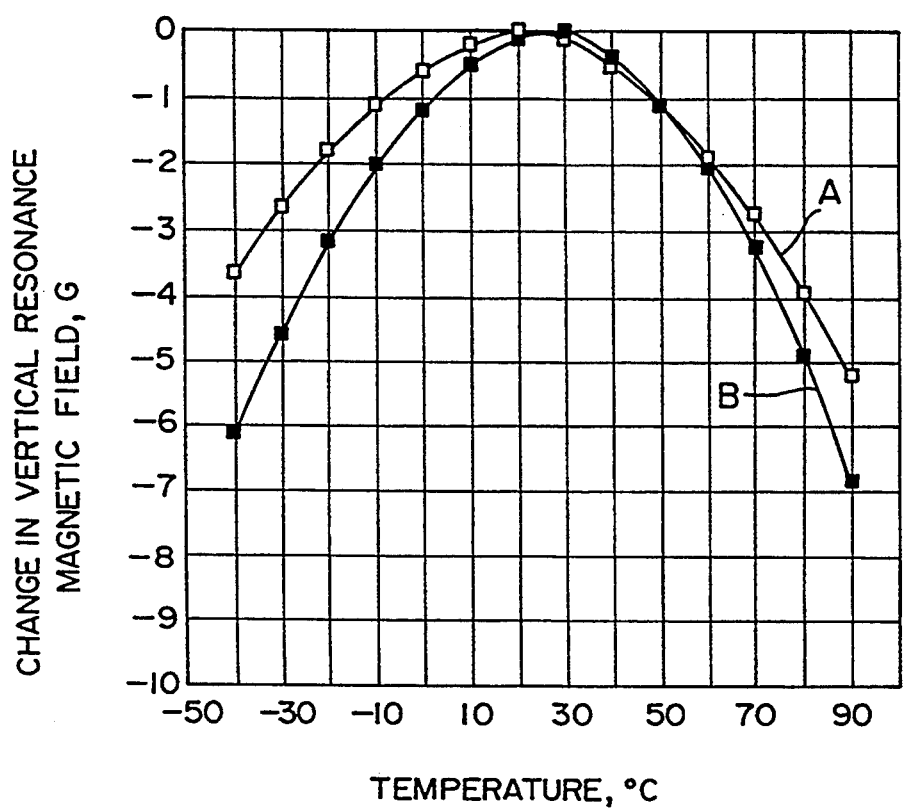
FIG. 1 is a graph showing the variation in the vertical resonance magnetic field for the magnetic garnet single crystal of the invention obtained by epitaxial growth as a function of temperature.

As is described above, the rare earth oxide-based magnetic garnet single crystal of the invention is characterized by the features including the specific chemical composition expressed by the above given formula (II), the specific form thereof in the form of a film epitaxially grown on the substrate surface in a specific crystallographic direction and the specific value of the growth-induced magnetic anisotropy constant $Ku^g$.

Namely, the rare earth oxide-based magnetic garnet single crystal of the invention is obtained in the form of a film on the surface of a single crystal substrate of a rare earth oxide-based garnet such as gadolinium gallium garnet, referred to as GGG hereinbelow, having a lattice constant of 1.2383 nm and yttrium-substituted GGG having a lattice constant of 1.2367 nm. The rare earth oxide-based garnet single crystals as the substrate can be prepared according to the well known Chochralski method from the melt of a mixture of the respective oxides by pulling up in the crystallographic direction of <111>. The single crystal rod obtained in this manner is sliced in a plane perpendicular to the growing axis into wafers which can be used as the substrate in the invention after lapping and polishing of the surface. The single crystal wafer usually has a lattice constant in the range from 1.2363 to 1.2386 nm.

The rare earth oxide-based magnetic garnet single crystal of the invention is formed on the surface of the above described substrate wafer by the liquid-phase epitaxial method, referred to as the LPE method hereinbelow. The magnetic garnet single crystal has a chemical composition expressed by the formula (II) given above. Although a rare earth oxide-based magnetic garnet single crystal having such a chemical composition is not novel, a particular advantage therein is that the rare earth oxide-based magnetic garnet single crystal has a lattice constant with a mismatching with that of the substrate single crystal as small as −0.0003 nm to +0.0015 nm so that an epitaxially grown film having a thickness up to 100 μm can be formed safely without crack formation. Further, the value of ΔH can be as small as 1 to 1.5 Oe when the value of the subscript y to define the content of the constituent element M is in the range from 0.6 to 0.8 along with the desirable effect of temperature compensation by the K1. The LPE method for the epitaxial growth of a rare earth oxide-based magnetic garnet single crystal in the form of a film on the substrate surface is well known.

The rare earth oxide-based magnetic garnet single crystal film formed by the LPE method must have a growth-induced magnetic anisotropy constant $Ku^g$ in the <111> direction in the range from $0.3 \times 10^4$ to $1.5 \times 10^4$ erg/cm$^3$. When the value of $Ku^g$ is too small, the desired effect of temperature compensation is obtained by the contribution of the $4\pi Ms$ and K1 alone as in the prior art not to solve the problems and the temperature range cannot be broader than 40 °C. corresponding to a 10 MHz variation of the oscillation frequency in the oscillator using the magnetostatic device. When the value of $Ku^g$ is too large, on the other hand, the lowest resonance frequency of the device cannot be smaller than 2 GHz due to the increase in the anisotropic magnetic field so that the device cannot work at low frequencies.

According to the discovery obtained by the inventors, the rare earth oxide-based magnetic garnet single crystal epitaxially grown on the substrate surface can be imparted with the above mentioned specific value of the growth-induced magnetic anisotropy constant $Ku^g$ when the single crystal as epitaxially grown is subjected to a heat treatment in air at a temperature in the range from 800° to 1200° C. for 1 to 100 hours. The reason for this improvement obtained by the heat treatment is presumably that the above given Kittel's resonance equation (I) is modified with an additional term of the growth-induced magnetically anisotropic magnetic field $2 Ku^g/Ms$ into a modified equation of $$f = r \cdot (Hres - N \cdot 4\pi Ms - 4/3 \cdot K1/Ms + 2Ku^g/Ms), \quad (III)$$

in which each symbol has the same meaning as defined for the equation (I), resulting in a great improvement in the temperature characteristics of the resonance magnetic field and frequency by the contribution of the three terms including $4\pi Ms$, K1 and $Ku^g$ so as to give an advantage that a magnetostatic device having good temperature characteristics and exhibiting a clear waveform by removing the superius in the waveform of the resonance spectrum can be easily and inexpensively obtained.

In the following, the present invention is illustrated in more detail by way of examples.

EXAMPLE 1

A platinum crucible was filled with a mixture of yttrium oxide $Y_2O_3$, bismuth oxide $Bi_2O_3$, gallium oxide $Ga_2O_3$ and iron oxide $Fe_2O_3$ as well as lead oxide PbO and boron oxide $B_2O_3$ as the constituents of a flux and the mixture was melted by heating at 1100° C. While keeping the temperature of the melt at 885° C., i.e. a temperature lower by 53° C. than the saturation temperature, a wafer of GGG of 25.4 mm diameter and 0.5 mm thickness having a surface of crystallographic (111) plane with a lattice constant of 1.2838 nm was dipped in the melt and gradually pulled up under rotation taking 100 minutes so as to grow an epitaxial garnet film having a thickness of 55.1 μm thereon in the <111> direction of the substrate wafer.

The epitaxially grown garnet film was subjected to the analysis by the ICP (inductively coupled plasma emission spectrophotometric) method for the determination of the chemical composition to find that the composition of the epitaxially grown garnet film could be expressed by the formula $Bi_{0.15}Y_{2.85}Fe_{4.34}Ga_{0.66}O_{12}$. Further, the lattice constant of the epitaxially grown film as determined by the bond method was 1.2385 nm. The saturation magnetization of the epitaxial garnet film was 734 G at 25° C. as determined by the vibrator method.

A 1 mm by 1 mm square test piece prepared by cutting the above obtained wafer with the epitaxial garnet film as prepared was subjected to the measurement of the $\Delta H$ value at a frequency of 9.2 GHz using a ferromagnetic resonance apparatus to find a value of as small as 1.2 Oe. Curve A of FIG. 1 shows the changes in the vertical resonance magnetic field at a constant frequency of 9.2 GHz as a function of temperature. As is clear from this figure, the change in the vertical resonance magnetic field is very small and does not exceed 3.0 Gauss in the temperature range from −12° C. to +72° C.

Although the values of K1 and the growth-induced magnetic anisotropy constant $Ku^g$ cannot be calculated from this vertical resonance magnetic field by using the equation (III), it is known that the growth-induced magnetic anisotropy constant disappears when the sample is subjected to an annealing treatment under appropriate conditions. Indeed, the growth-induced magnetic anisotropy constant of the above prepared 1 mm by 1 mm square test piece disappeared after an annealing treatment at 950° C. in air for 473 hours so that the K1 value could be obtained from the vertical resonance magnetic field after the annealing treatment to find that it was −0.28 erg/cm³, which was compared with the corresponding value before the annealing treatment to obtain the value of $Ku^g$ of $1.35 \times 10^4$ erg/cm³ by calculation using the equation (III).

Figure 2:
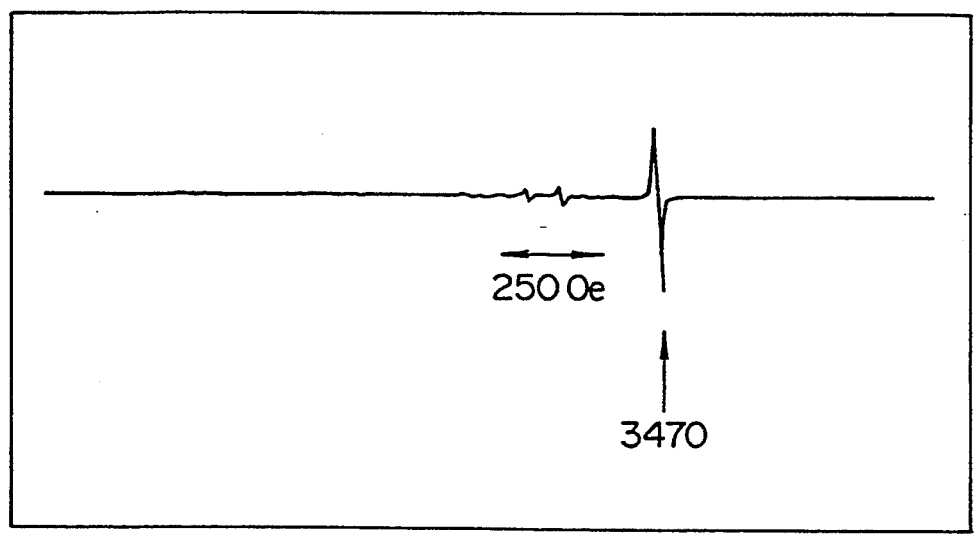
FIGS. 2 and 3 are each a resonance spectrum of the inventive magnetic garnet single crystal of the invention after and before the annealing heat treatment, respectively, in Example 1.
Figure 3:
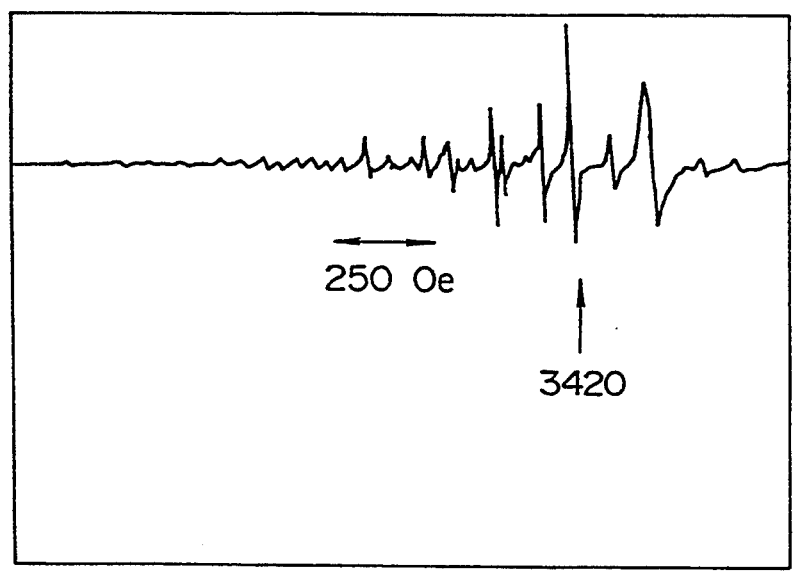

Curve B in FIG. 1 shows the changes in the vertical resonance magnetic field at a constant frequency of 9.2 GHz as a function of temperature for the same test piece as for Curve A after an an annealing treatment at 950° C. in air for 18 hours indicating that the change in the vertical resonance magnetic field is small and does not exceed 3.0 Gauss in the temperature range of from −18° C. to +68° C. The thus annealed indicated a $\Delta H$ value of 1.1 Oe and $Ku^g$ of $1.13 \cdot 10^4$ erg/cm³. FIGS. 2 and 3 illustrate the waveform of the resonance spectrum at a magnetic field of 3470±250 Gauss after and before the annealing treatment for 18 hours, respectively. As is understood from comparison of these spectra, the annealing heat treatment has an effect of removing the so many superiuses before the treatment to give a clear spectrum after the treatment.

EXAMPLE 2

A magnetostatic chip of 1 mm by 1 mm square was prepared from the wafer sample obtained in Example 1 after the 18 hours annealing treatment, of which a magnetostatic transducer was provided to serve as a magnetostatic resonator. A magnetostatic oscillator was constructed by connecting this resonator to the source terminal of a field-effect transistor (FET), connecting the gate terminal of FET to a feedback coil, connecting the drain terminal of the FET to a matching circuit and placing the resonator between the pole pieces of an electromagnet capable of generating a magnetic field in the direction perpendicular to the 1 mm by 1 mm plane of the magnetostatic chip.

Figure 4:
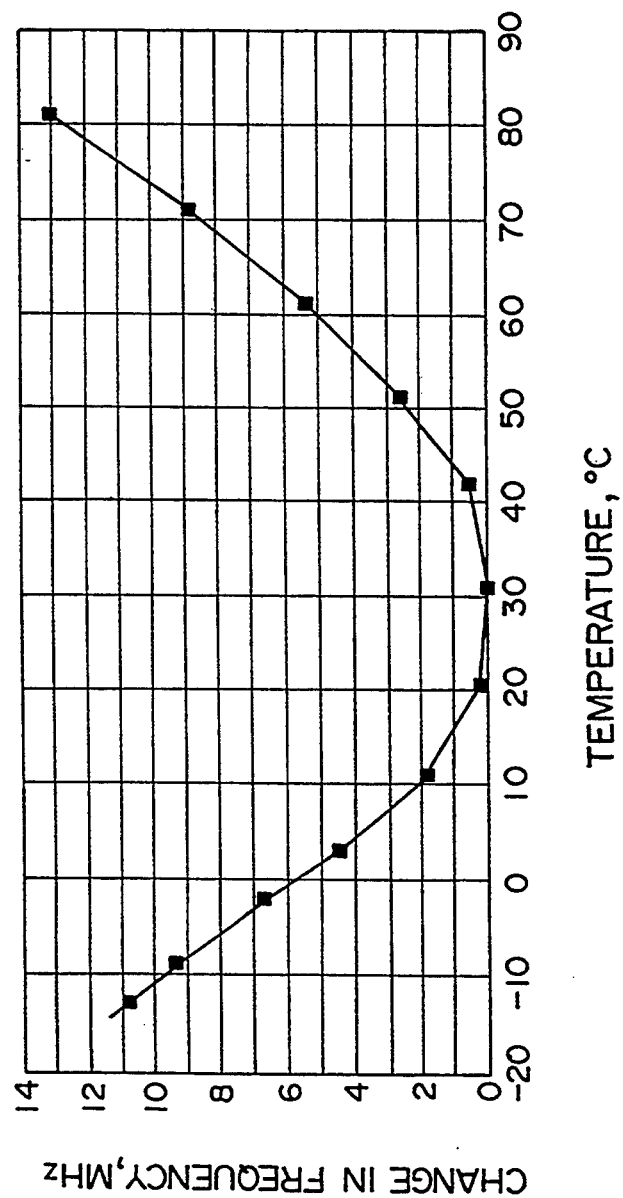
FIG. 4 is a graph showing the variation in the oscillation frequency in the magnetostatic oscillator according to the invention as a function of temperature.

The oscillation frequency of the high frequency output from the microwave oscillator was measured in a constant magnetic field of 2000 Oe generated by the electromagnet at varied temperatures to find that the variation in the frequency did not exceed 10 MHz within the temperature range from −10° C. to +70° C. as is shown in FIG. 4.

EXAMPLE 3

A platinum crucible was filled with a mixture of yttrium oxide $Y_2O_3$, bismuth oxide $Bi_2O_3$, gallium oxide $Ga_2O_3$ and iron oxide $Fe_2O_3$ as well as lead oxide PbO and boron oxide $B_2O_3$ as the constituents of a flux and the mixture was melted by heating at 1100° C. While keeping the temperature of the melt at 885° C., i.e. a temperature lower by 53° C. than the saturation temperature, a wafer of GGG of 25.4 mm diameter and 0.5, mm thickness having a surface of crystallographic (111) plane with a lattice constant of 1.2838 nm was dipped in the melt and gradually pulled up under rotation taking 12 minutes so as to grow an epitaxial garnet film thereon in the <111> direction of the substrate wafer having a thickness of 55.0 μm.

The epitaxially grown garnet film was subjected to the analysis by the ICP (inductively coupled plasma emission spectrophotometric) method for the chemical composition to find that the composition of the epitaxially grown garnet film could be expressed by the formula $Bi_{0.15}Y_{2.85}Fe_{4.34}Ga_{0.66}O_{12}$. Further, the lattice constant of the epitaxially grown film as determined by the bond method was 1.2385 nm. The saturation magnetization of the epitaxial garnet film was 734 G at 25° C. as determined by the vibrator method. The growth-induced anisotropy constant $Ku^g$ in the <111> direction was $1.60 \times 10^4$ erg/cm³ at 25° C. as determined in the same manner as in Example 1.

Figure 5:
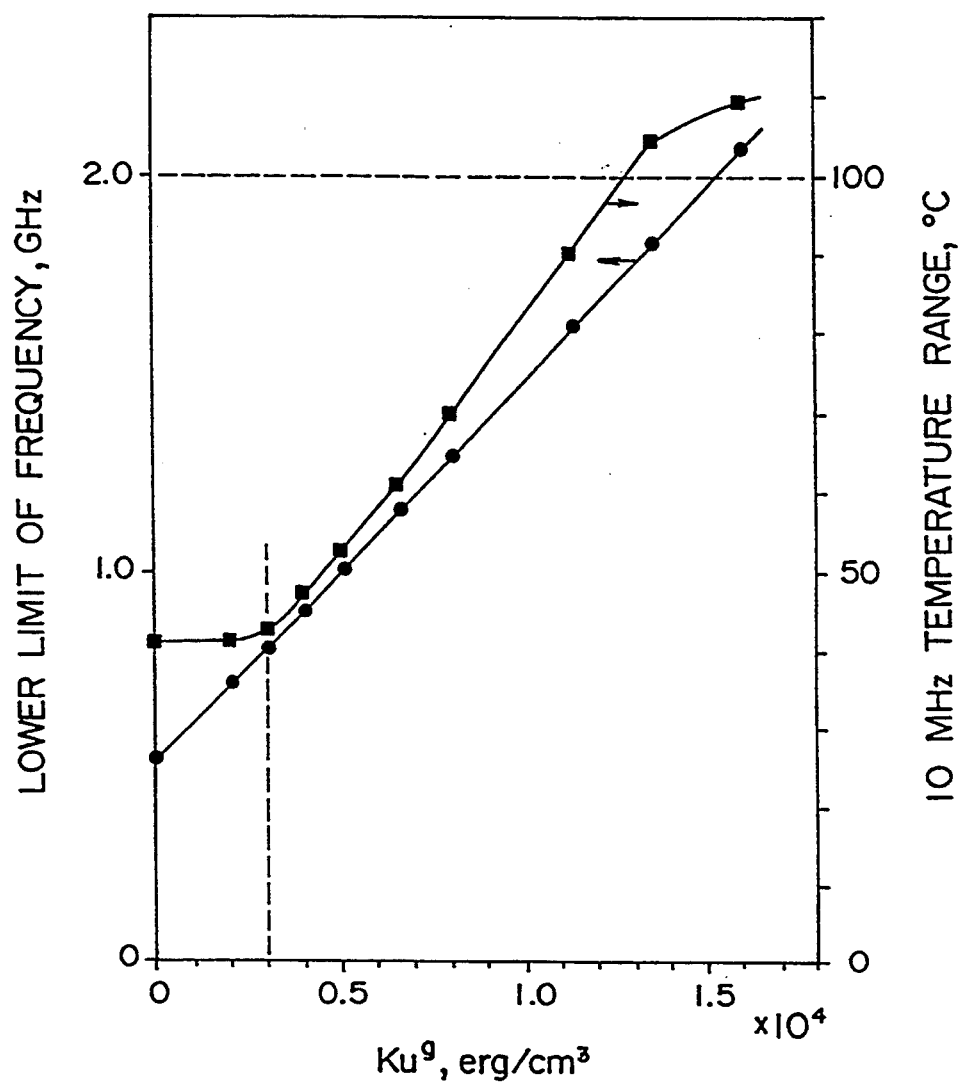
FIG. 5 is a graph showing the lower limit of frequency and temperature range corresponding to 10 MHz in the inventive magnetostatic device as a function of the $Ku^g$ value.

The test specimens of the 1 mm by 1 mm chips were subjected to an annealing heat treatment at 950° C. in air for a varied length of time to be imparted with various values of $Ku^g$. Each of these test pieces was used for constructing an oscillator in the same manner as in Example 2 and the oscillators were subjected to the measurement of the lowest frequency of the output which could be set into oscillation and the temperature range in which the variation in the oscillation frequency did not exceed 10 MHz to give the results shown in FIG. 5 each as a function of the $Ku^g$ value. It is understood from this figure that the temperature range for 10 MHz frequency variation is as small as 40° C. when the $Ku^g$ is smaller than $0.3 \times 10^4$ erg/cm³ at 25° C. and the lowest frequency cannot be smaller than 2 GHz when the $Ku^g$ is larger than $1.5 \times 10^4$ erg/cm³ at 25° C.

What is claimed is:

1. A rare earth oxide-based magnetic garnet single crystal in the form of a film epitaxially grown in the crystallographic direction of <111> on the substrate of a rare earth oxide-based garnet single crystal followed by a heat treatment at a temperature in the range from 800° to 1200° C., which has a chemical composition expressed by the formula

$(Bi_xR_{3-x})(Fe_{5-y}M_y)O_{12}$, in which R is a rare earth element selected from the group consisting of yttrium, lutetium and lanthanum or a combination thereof, M is gallium, aluminum or a combination thereof, the subscript x is a positive number in the range from 0.02 to 0.4 and the subscript y is a positive number in the range from 0.6 to 0.8, and has a growth-induced magnetic anisotropy constant $Ku^g$ in the range from $0.3 \times 10^4$ to $1.5 \times 10^4$ erg/cm$^3$ in the crystallographic <111> direction.

2. The rare earth oxide-based magnetic garnet single crystal as claimed in claim I in which the heat treatment is conducted for a length of time in the range from 1 to 100 hours.

3. A magnetostatic device of the invention comprises the elements of:
(a) a layer of the rare earth oxide-based magnetic garnet single crystal in the form of an epitaxially grown film as defined in claim 1;
(b) a pair of electrodes provided on the surfaces of the element (a); and
(c) a means for generating a magnetic field in the direction perpendicular to the principal plane of the element (a).

* * * * *